United States Patent
Jeong et al.

(10) Patent No.: US 8,120,520 B2
(45) Date of Patent: Feb. 21, 2012

(54) SUCCESSIVE APPROXIMATION ANALOG/DIGITAL CONVERTER AND TIME-INTERLEAVED SUCCESSIVE APPROXIMATION ANALOG/DIGITAL CONVERTER

(75) Inventors: Chan Yong Jeong, Seoul (KR); Chul Woo Kim, Seoul (KR); Ho Kyu Lee, Gyunggi-do (KR); Chul Gyun Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 172 days.

(21) Appl. No.: 12/719,256

(22) Filed: Mar. 8, 2010

(65) Prior Publication Data

US 2011/0102219 A1      May 5, 2011

(30) Foreign Application Priority Data

Nov. 2, 2009   (KR) ........................ 10-2009-0104939

(51) Int. Cl.
*H04M 1/34* (2006.01)
(52) U.S. Cl. ...................................... 341/163; 341/155
(58) Field of Classification Search .................. 341/122, 341/155, 144, 163
See application file for complete search history.

(56) References Cited

U.S. PATENT DOCUMENTS

| | | | | |
|---|---|---|---|---|
| 5,184,131 A | * | 2/1993 | Ikeda | ............................ 341/165 |
| 7,477,177 B2 | | 1/2009 | Kuramochi et al. | |
| 7,944,387 B2 | * | 5/2011 | Ohnhaeuser et al. | ......... 341/172 |
| 2007/0297238 A1 | * | 12/2007 | Cho et al. | ................. 365/185.23 |
| 2008/0100490 A1 | | 5/2008 | Chatal et al. | |

FOREIGN PATENT DOCUMENTS

KR      1020000004486 A      1/2000

OTHER PUBLICATIONS

KIPO Office Action for KR 10-2009-0104939, issued Apr. 12, 2011.

* cited by examiner

*Primary Examiner* — Peguy Jean Pierre
(74) *Attorney, Agent, or Firm* — Lowe, Hauptman, Ham & Berner, LLP

(57) ABSTRACT

A successive approximation analog/digital converter includes a sample & hold part sampling and holding an intensity of an analog input signal using a single clock cycle of a clock signal; a first comparator comparing the intensity of the analog input signal with comparison voltages determined according to estimated digital values per clock cycle following an operating clock cycle of the sample & hold part; a second comparator comparing the intensity of the analog input signal with a value equal to ½ of a preset reference voltage in the latter half of the operating clock cycle of the sample & hold part; a successive approximation register determining a value of an MSB of a digital value to be converted according to the comparison result of the second comparator and values of bits successive to the MSB according to the comparison result of the first comparator, and generating the estimated digital values by applying estimated values to undetermined bits; and a digital/analog converter generating the comparison voltages using the estimated digital values and the reference voltage.

2 Claims, 5 Drawing Sheets

SUCCESSIVE APPROXIMATION ANALOG/DIGITAL CONVERTER AND TIME-INTERLEAVED SUCCESSIVE APPROXIMATION ANALOG/DIGITAL CONVERTER

CROSS-REFERENCE TO RELATED APPLICATIONS

This application claims the priority of Korean Patent Application No. 10-2009-0104939 filed on Nov. 2, 2009, in the Korean Intellectual Property Office, the disclosure of which is incorporated herein by reference.

BACKGROUND OF THE INVENTION

1. Field of the Invention

The present invention relates to a successive approximation analog/digital converter (ADC), and more particularly, to a successive approximation ADC allowing for an improvement in operating speed by reducing the time required for data conversion.

2. Description of the Related Art

Analog signals such as sounds or waves existing in the natural world are converted into digital signals through an analog/digital converter (ADC), and then the converted digital signals are used in digital devices such as televisions or cellular phones. With the current digitizing trend of many electronic devices, analog/digital conversion technology related to the interface of the analog and digital signal processing is becoming increasingly important.

With regard to such an ADC, a variety of technologies in many applications have been proposed and practically applied. Particularly, in wireless communication devices, ADCs require low power consumption in light of characteristics of wireless communication devices. Also, with increased interest in broadband communications, ADCs capable of achieving high-speed operation as well as low power dissipation are required.

Among a variety of ADCs, a successive approximation ADC has a relatively simple circuit structure relative to ADCs having different structures and is presented as a low power design. By applying time-interleaved technology to such a successive approximation ADC, it has been developed to allow the operating speed of the ADC to be enhanced by as much as an interleaving factor. Also, the development of semiconductor manufacturing process technology has made a contribution to the reduction of circuit line width, and thus the operating speed of the ADC has been enhanced. For this reason, a successive approximation ADC using the time-interleaved technology takes advantage of low power over existing ADCs with different structures and operates at a high speed, so it is known as an optimized structure in terms of power consumption and operating speed.

However, since such a successive approximation ADC converts analog signals into digital signals through a multi-stage comparison and approximation procedure, the conversion of input analog signals into digital signals can be a time-consuming process. That is, in the case of a general successive approximation ADC having an N-bit resolution, the time required for converting the data becomes the time of total N+1 clock cycles by adding the time of N clock cycles required for comparing N-times and that of 1 clock cycle required for analog signal sampling.

Therefore, in order to improve the operating speed of the successive approximation ADC, the reduction of clock cycles required for data conversion is required.

SUMMARY OF THE INVENTION

An aspect of the present invention provides a successive approximation analog/digital converter (ADC) allowing for an improvement in operating speed.

An aspect of the present invention also provides a time-interleaved successive approximation ADC allowing for an improvement in operating speed.

According to an aspect of the present invention, there is provided a successive approximation analog/digital converter including: a sample & hold part sampling and holding an intensity of an analog input signal by using a single clock cycle of a clock signal; a first comparator comparing the intensity of the analog input signal held by the sample & hold part with comparison voltages determined according to estimated digital values per clock cycle following an operating clock cycle of the sample & hold part; a second comparator comparing the intensity of the analog input signal sampled by the sample & hold part with a value equal to ½ of a preset reference voltage in the latter half of the operating clock cycle of the sample & hold part; a successive approximation register determining a value of a most significant bit (MSB) of a digital value to be converted according to the comparison result of the second comparator, determining values of bits successive to the MSB according to the comparison result of the first comparator, and generating the estimated digital values by applying estimated values to undetermined bits; and a digital/analog converter generating the comparison voltages by using the estimated digital values and the reference voltage.

According to another aspect of the present invention, there is provided a time-interleaved successive approximation analog/digital converter including a plurality of analog/digital converters (ADCs) successively operating according to corresponding clock cycles; a second comparator comparing the intensity of the analog input signal with a value equal to ½ of the preset reference voltage in the latter half of the operating clock cycle of the sample & hold part included in each of the plurality of ADCs; and a switching part transmitting the comparison result of the second comparator to the successive approximation register included in each of the plurality of ADCs according to operating clock cycles of the plurality of corresponding ADCs. Each of the plurality of ADCs includes a sample & hold part sampling and holding an intensity of an analog input signal by using a single clock cycle of a clock signal; a first comparator comparing the intensity of the analog input signal held by the sample & hold part with comparison voltages determined according to estimated digital values per clock cycle following an operating clock cycle of the sample & hold part; a successive approximation register determining values of bits successive to a most significant bit (MSB) of a digital value to be converted according to the comparison result of the first comparator and generating the estimated digital values by applying estimated values to undetermined bits; and a digital/analog converter generating the comparison voltages by using the estimated digital values and a preset reference voltage. The successive approximation register included in each of the plurality of ADCs determines a value of the MSB of the digital value to be converted according to the comparison result of the second comparator.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
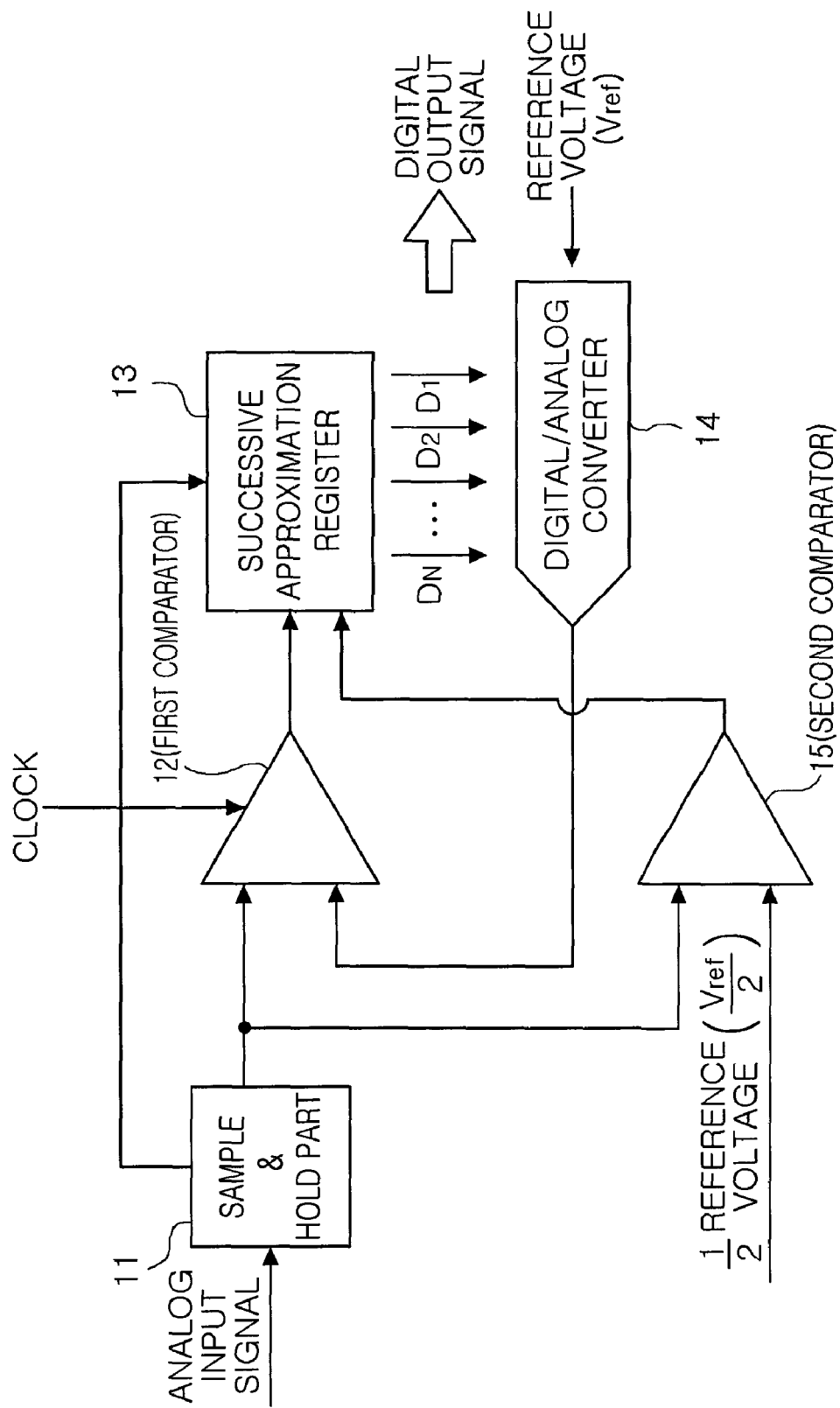
FIG. 1 is a block diagram illustrating a successive approximation analog/digital converter (ADC) according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

FIG. 1 is a block diagram illustrating a successive approximation analog/digital converter (ADC) according to an exemplary embodiment of the present invention.

Referring to FIG. 1, the successive approximation ADC according to this embodiment may include a sample & hold part 11, a first comparator 12, a successive approximation register 13, a digital/analog converter (DAC) 14, and a second comparator 15.

The sample & hold part 11 receives an analog input signal for digital conversion, samples the intensity of the analog input signal at a predetermined time point, and maintains the sampled intensity of the analog input signal while comparison is performed as many as the number of bits set in the successive approximation ADC. The sample & hold part 11 may operate according to a clock signal and perform sampling and holding in a single clock cycle.

The first comparator 12 compares the intensity of the analog input signal sampled and held by the sample & hold part 11 with comparison voltages determined and output by the DAC according to estimated digital values output by the successive approximation register 13, and outputs the comparison result thereof. The operation of the first comparator 12 may start from the clock cycle following the clock cycle used by the sample & hold part 11. According to this embodiment, the first comparator 12 may perform a comparison in order to determine values of the next most significant bit to a least significant bit (LSB) of a digital value targeted to be converted.

The second comparator 15 compares the intensity of the analog input signal sampled by the sample & hold part 11 with a value equal to ½ of that of a preset reference voltage Vref. The second comparator 15 operates in the latter half of the operating clock cycle in which the sample & hold part 11 operates. The comparison result of the second comparator 15 is input into the successive approximation register 13 and used to determine a value of a most significant bit (MSB) of a digital value targeted to be converted.

The successive approximation register 13 determines a value of the MSB of the digital value to be converted according to the comparison result of the second comparator 15 and values of bits successive to the MSB according to the comparison result of the first comparator 12, and generates estimated digital values by applying estimated values to undetermined bits. When an estimated digital value for the LSB is input into the first comparator 12, the successive approximation register 13 determines a value of the LSB according to the comparison result. Also, the successive approximation register 13 outputs the determined values of MSB to LSB as final-converted digital output signals.

The DAC 14 receives the estimated digital values output by the successive approximation register 13 and the reference voltage Vref, and generates the comparison voltages used by the first comparator 12. For example, when the MSB of a digital value output by the successive approximation register 13 is determined as "1" and its successive bit is an estimated digital value to be compared, the DAC 14 may output a comparison voltage having a value equal to 3*Vref/4. When the MSB is determined as "0" and its successive bit is an estimated digital value to be compared, the DAC 14 may output a comparison voltage having a value equal to Vref/4.

Figure 2:
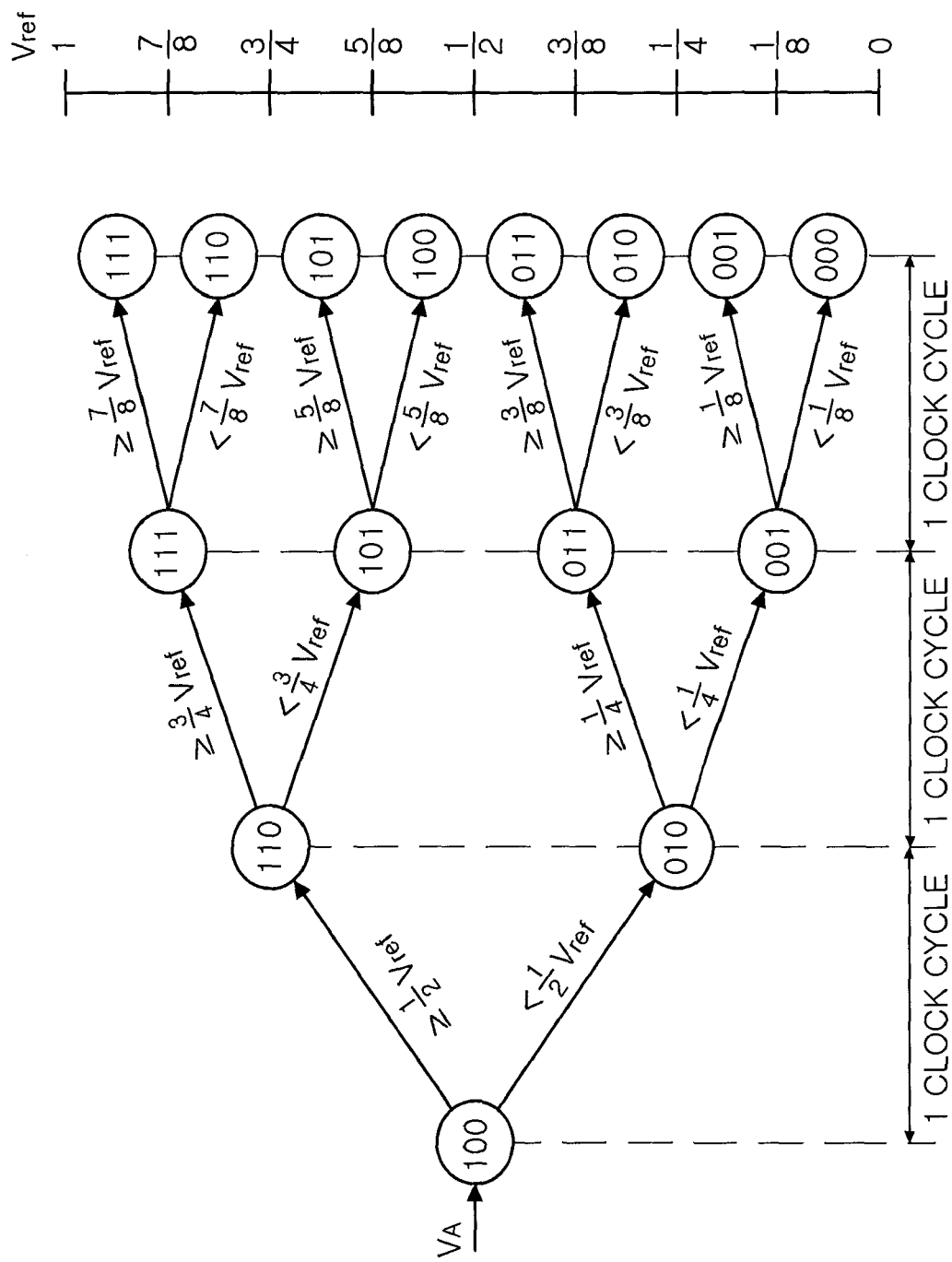
FIG. 2 illustrates the operating principle of a successive approximation ADC according to an exemplary embodiment of the present invention.

FIG. 2 illustrates the operating principle of a successive approximation ADC according to an exemplary embodiment of the present invention.

FIG. 3(a) and FIG. 3(b) are timing diagrams illustrating the comparison between the operation of a successive approximation ADC according to an exemplary embodiment of the present invention and that of a typical successive approximation ADC.

Figure 3:
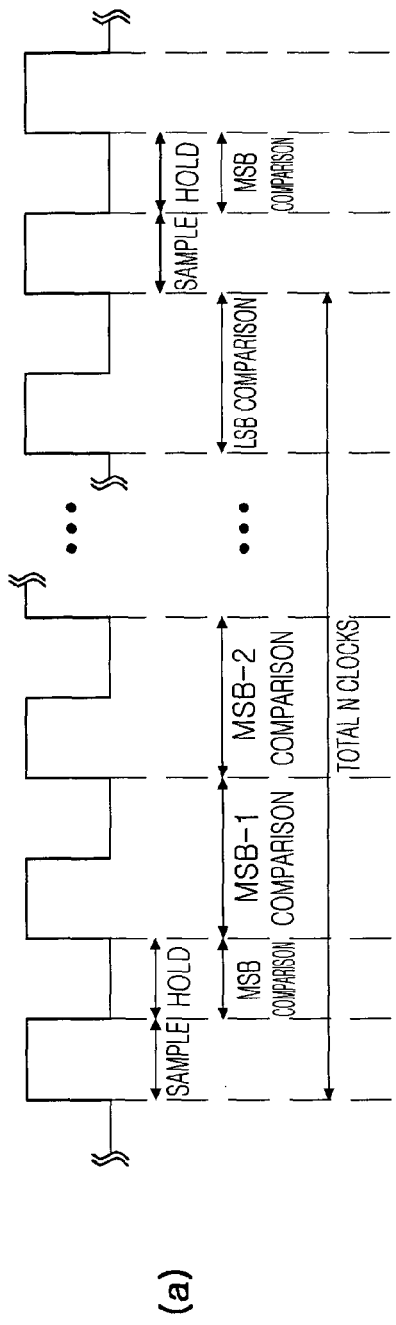
FIG. 3(a) and FIG. 3(b) are timing diagrams illustrating the comparison between the operation of a successive approximation ADC according to an exemplary embodiment of the present invention and that of a typical successive approximation ADC.
Figure 3:
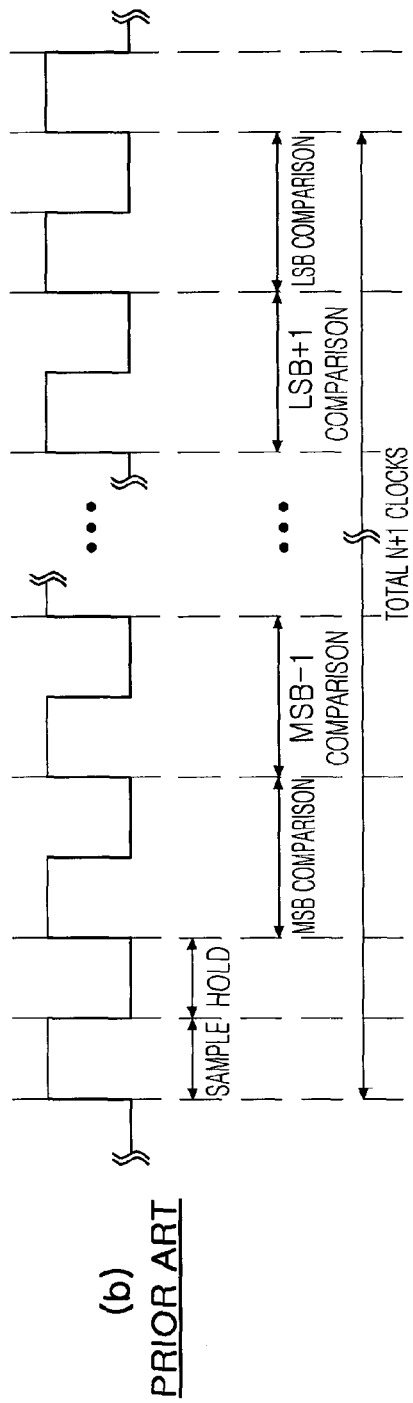

Hereinafter, the operation and effect of a successive approximation ADC according to an exemplary embodiment of the invention will be described in detail with reference to FIGS. 1 through 3.

First of all, as the operation of the successive approximation ADC starts, the intensity of an analog input signal is sampled by the sample & hold part 11. This sampled intensity of the analog input signal may be represented as a voltage value $V_A$. As shown in FIG. 3(a), sampling may be performed in the first half of a single clock cycle of a clock signal, and holding, i.e., maintaining may be performed in the latter half thereof.

According to this embodiment, the second comparator 15 is included in order to perform a comparison for determining a value of an MSB. The second comparator 15 compares the sampled intensity of the analog input signal, obtained after the first half of the clock cycle in which the sampling is performed, with a value equal to ½ of that of a reference voltage Vref, and outputs the comparison result thereof. Since the comparison voltage for determining the value of the MSB in the successive approximation ADC is fixed as ½ of the reference voltage Vref, the comparison for determining the value of the MSB may be performed by the second comparator 15, without regard to an estimated digital value output by the successive approximation register 13.

Subsequently, the successive approximation register 13 receives the comparison result determined by the second comparator 15 and determines the value of the MSB according to that comparison result, and then outputs an estimated digital value to be used in the comparison for determining a value of the successive bit. The estimated digital value to be used in the comparison for determining the value of the successive bit is input into the DAC 14, and the DAC 14 generates and outputs a comparison voltage by using the reference voltage Vref and the estimated digital value. As shown in FIG. 3(a), the comparison for determining the value of the bit successive to the MSB is performed in the clock cycle following the clock cycle used by the sample & hold part 11. Such a comparison may be repeated up to a final bit of a digital value targeted to be converted.

The operation of the successive approximation ADC will be described with reference to FIG. 2. FIG. 2 illustrates an example of generating a 3-bit digital value. In order to determine a value of an MSB, an estimated digital value is set as "100" and the intensity of an analog input signal sampled by the sample & hold part 11 and a value equal to ½ of that of a reference voltage are compared by the second comparator 15. When the intensity of the analog input signal is greater than the value equal to ½ of that of the reference voltage, the successive approximation register 13 maintains the MSB as "1." When the intensity of the analog input signal is smaller than the value equal to ½ of that of the reference voltage, the successive approximation register 13 converts the MSB as "0." For example, in the case that the MSB is determined as "1," the successive approximation register 13 outputs the successive estimated digital value as "110." That is, the MSB is determined as "1" and its successive bit is output as a digital value estimated on the basis of "1." When the bit "110" is input, the DAC 14 outputs a comparison voltage having a magnitude equal to ¾'s of the reference voltage and the first comparator 12 performs the comparison between the comparison voltage and the maintained intensity of the analog input signal. When the intensity of the analog input signal is greater than ¾'s of the reference voltage, the successive approximation register 13 maintains the bit successive to the MSB as "1." When the intensity of the analog input signal is smaller than ¾'s of the reference voltage, the successive approximation register 13 converts the bit successive to the MSB into "0." Through these comparisons, analog values may be converted into digital values.

According to an exemplary embodiment of the invention, as shown in FIG. 3(a) and FIG. 3(b), since the comparison for determining the value of the MSB is performed by the second comparator 15 within the operating clock cycle of the sample & hold part 11, the number of clock cycles required in the totality of conversion operations is reduced by one, as compared with the typical successive approximation ADC. That is, when the typical successive approximation ADC performs N-bit digital conversion, N+1 clock cycles are required in light of adding N clock cycles required for each N-bit comparison and one clock cycle required for the sample & hold. According to this embodiment of the invention, however, digital conversion can be terminated within N clock cycles, thereby saving time required for digital conversion.

Figure 4:
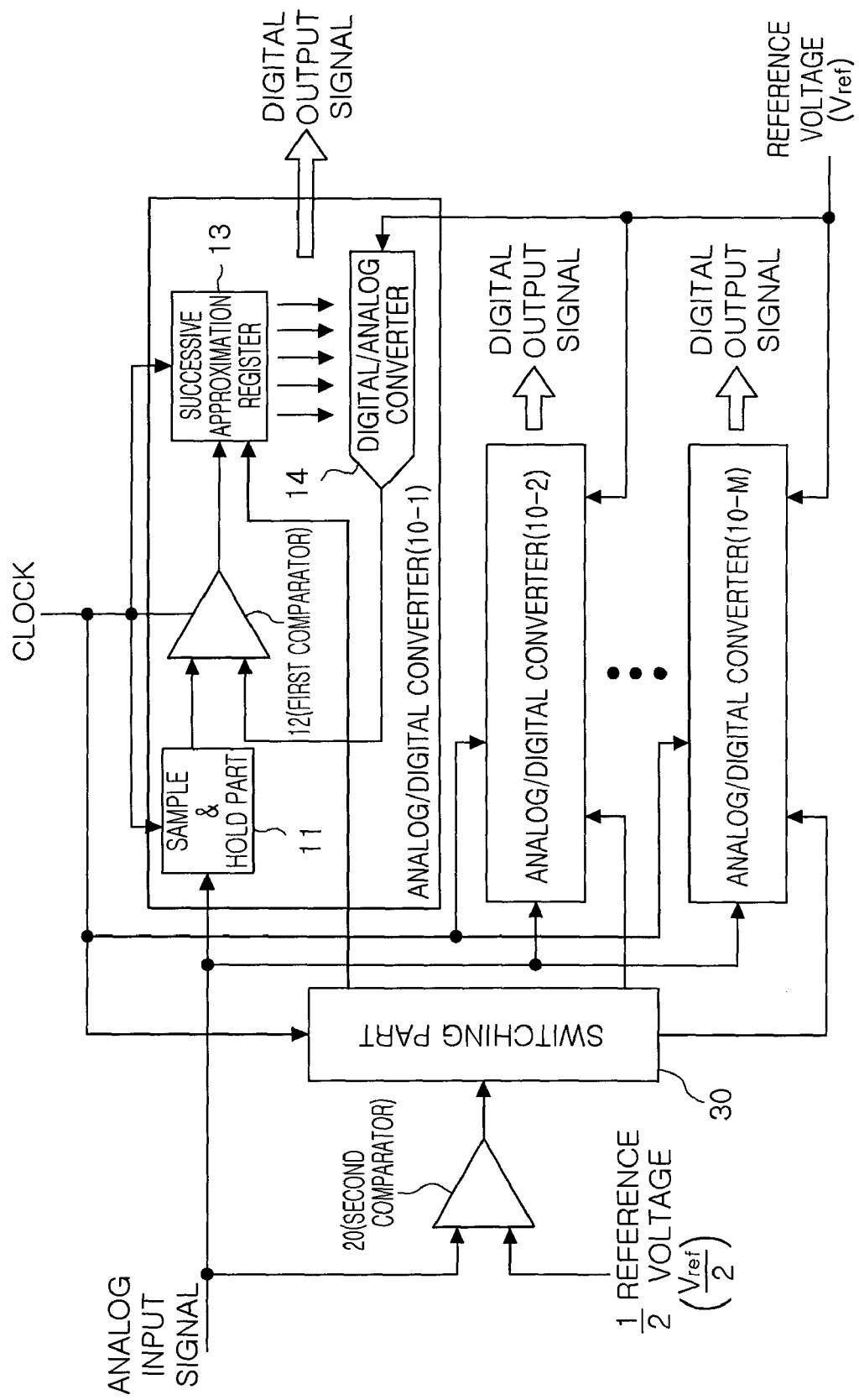
FIG. 4 is a block diagram illustrating a time-interleaved successive approximation ADC according to an exemplary embodiment of the present invention.

FIG. 4 is a block diagram illustrating a time-interleaved successive approximation ADC according to an exemplary embodiment of the present invention.

As shown in FIG. 4, a time-interleaved successive approximation ADC according to this embodiment of the invention includes a plurality of analog/digital converters (ADCs) 10-1 to 10-M, a second comparator 20, and a switching part 30.

Each of the plurality of ADCs 10-1 to 10-M may include the sample & hold part 11 sampling and holding the intensity of an analog input signal by using a single clock cycle of a clock signal; the first comparator 12 comparing the intensity of the analog input signal held by the sample & hold part 11 with comparison voltages determined according to estimated digital values per clock cycle following the operating clock cycle of the sample & hold part 11; the successive approximation register 13 determining values of bits successive to the MSB of a digital value to be converted according to the comparison result of the first comparator and generating the estimated digital values by applying estimated values to undetermined bits; and the DAC 14 generating the comparison voltages by using the estimated digital values and a preset reference voltage. Since the configuration of each of the plurality of ADCs 10-1 to 10-M is substantially the same as that of the aforementioned successive approximation ADC of FIG. 1 except for the second comparator, a detailed description thereof will be omitted. Each of the plurality of ADCs 10-1 to 10-M may operate successively with a difference of a single clock cycle.

The second comparator 20 compares the intensity of the analog input signal and a value equal to ½ of that of the preset reference voltage in the latter half of the operating clock cycle of the sample & hold part 11 included in each of the plurality of ADCs 10-1 to 10-M, and provides the comparison result thereof for determining a value of the MSB to the successive approximation register 13 included in the corresponding ADCs 10-1 to 10-M. That is, the second comparator 20 may compare the intensity of the analog input signal, required for the comparison for determining the value of the MSB in each of the plurality of ADCs 10-1 to 10-M, with the reference voltage according to operating clock cycles of the corresponding ADCs 10-1 to 10-M, and transmit the comparison result thereof to the successive approximation register 13 included in the corresponding ADCs 10-1 to 10-M.

The switching part 30 may transmit the comparison result of the second comparator 20 to the successive approximation register 13 included in the corresponding ADCs 10-1 to 10-M according to the operating clock cycles of the corresponding ADCs 10-1 to 10-M.

Figure 5:
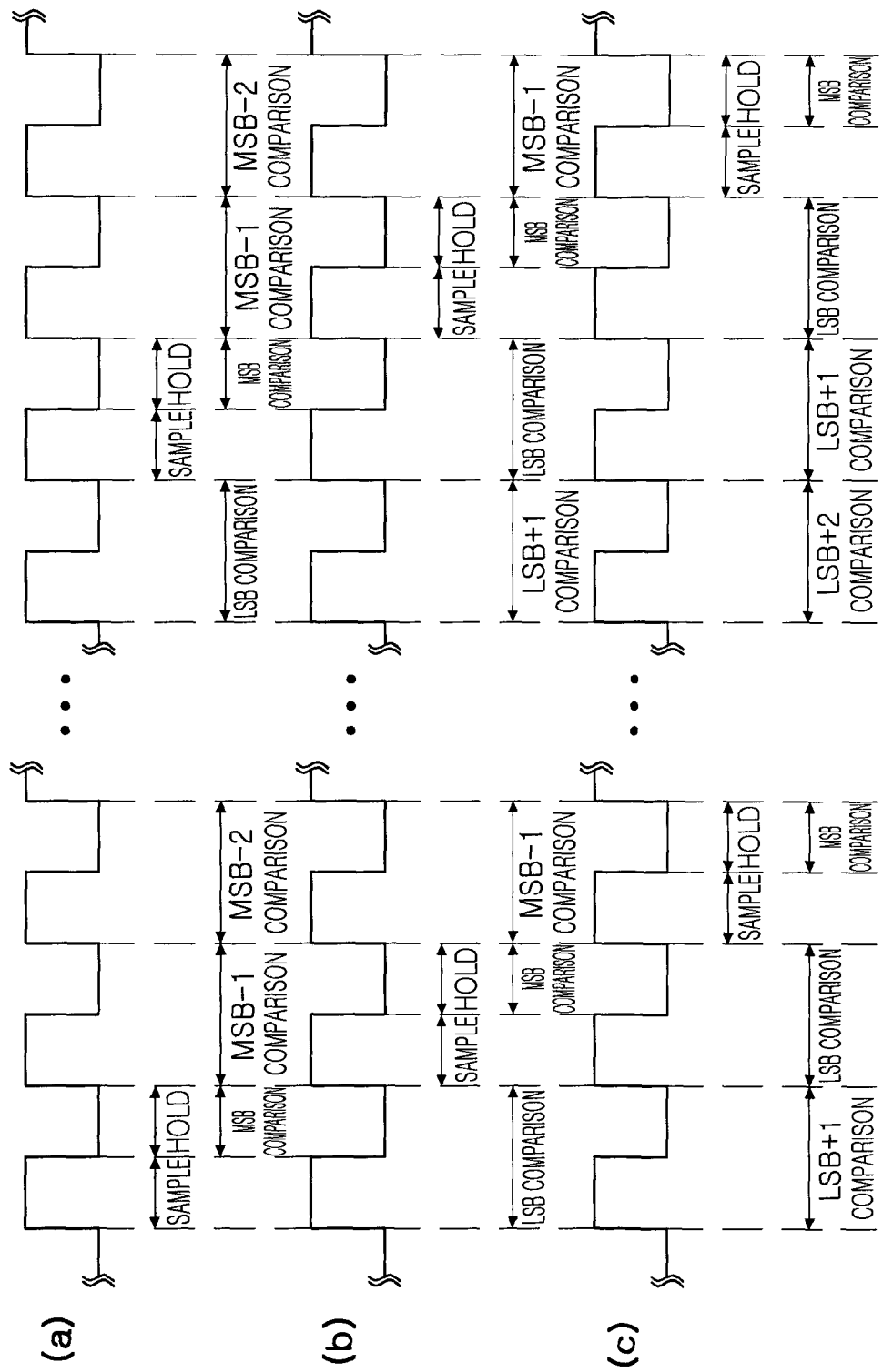
FIG. 5(a) to FIG. 5(c) are timing diagrams illustrating the operation of a time-interleaved successive approximation ADC according to an exemplary embodiment of the present invention.

The operation and effect of the aforementioned time-interleaved successive approximation ADC will be understood more clearly with reference to FIGS. 5(a) to (c).

FIG. 5(a) to FIG. 5(c) are timing diagrams illustrating the operation of a time-interleaved successive approximation ADC according to an exemplary embodiment of the present invention.

As shown in FIGS. 5(a) to (c), since all of the plurality of ADCs 10-1 to 10-M, the second comparator 20, and the switching part 30 operate in the same clock cycle, their operations may be interlinked with one another.

As shown in FIGS. 5(a) to (c), when the first ADC 10-1 operates, sampling and holding are performed in a single clock cycle. During the latter half of this clock cycle in which the holding is performed, the comparison for determining a value of an MSB is performed by the second comparator 20. Also, during the latter half of this clock cycle, the comparison result of the second comparator 20 is input into the successive approximation register 13 due to the connection between the output of the second comparator 20 and the successive approximation register 13 via the switching part 30, and accordingly the value of the MSB is determined. After that, the first ADC 10-1 may perform a comparison operation for determining a value of the bit successive to the MSB in the same manner as described above with reference to FIGS. 1 through 3.

In the successive approximation ADC of FIG. 1, when the comparison for determining the value of the MSB is completed, the second comparator 15 may stop its operation during comparisons for determining the values of the bits successive to the MSB. On the other hand, in the time-interleaved successive approximation ADC of FIG. 4, the second comparator 20 resumes its operation in the clock cycle following the clock cycle in which sampling and holding in the first ADC 10-1 are performed, in order to perform the comparison for determining the value of the MSB in the second ADC 10-2 after the comparison for determining the value of the MSB in the first ADC 10-1 is completed. This is because the operations of the plurality of ADCs 10-1 to 10-M are successively performed with a difference of a single clock cycle.

As described above, the second comparator 20 may perform comparison operations for determining values of MSBs in all the plurality of ADCs 10-1 to 10-M according to operating clock cycles of the corresponding ADCs 10-1 to 10-M. The comparison result of the second comparator 20 may be transmitted to the successive approximation register 13 included in the corresponding ADCs 10-1 to 10-M by the switching part 30 which operates according to the operating clock cycles of the corresponding ADCs 10-1 to 10-M.

In the time-interleaved successive approximation ADC according to an exemplary embodiment of the invention, in a manner similar to the aforementioned successive approximation ADC of FIG. 1, the comparison for determining the value of the MSB performed in each of the ADCs 10-1 to 10-M is completed by the second comparator 20 within the operating clock cycle of the sample & hold part 11, whereby the number of clock cycles required for the total conversion operations is reduced by one as compared with the typical successive approximation ADC.

Also, although the number of ADCs 10-1 to 10-M increases, the comparison for determining the value of the MSB required in each of the ADCs 10-1 to 10-M is performed by the single second comparator 20, whereby chip size is prevented from being increased when manufactured.

As set forth above, according to exemplary embodiments of the invention, a successive approximation ADC is capable of enhancing its operating speed by reducing clock cycles by one.

Also, according to exemplary embodiments of the invention, a time-interleaved successive approximation ADC is capable of enhancing its operating speed by reducing clock cycles by one.

In the time-interleaved successive approximation ADC including a plurality of ADCs according to exemplary embodiments of the invention, an additional comparator for determining values of MSBs is shared by the plurality of ADCs, thereby reducing required chip size when manufacturing the time-interleaved successive approximation ADC.

While the present invention has been shown and described in connection with the exemplary embodiments, it will be apparent to those skilled in the art that modifications and variations can be made without departing from the spirit and scope of the invention as defined by the appended claims.

What is claimed is:

1. A successive approximation analog/digital converter comprising:
   a sample & hold part sampling and holding an intensity of an analog input signal by using a single clock cycle of a clock signal;
   a first comparator comparing the intensity of the analog input signal held by the sample & hold part with comparison voltages determined according to estimated digital values per clock cycle following an operating clock cycle of the sample & hold part;
   a second comparator comparing the intensity of the analog input signal sampled by the sample & hold part with a value equal to ½ of a preset reference voltage in the latter half of the operating clock cycle of the sample & hold part;
   a successive approximation register determining a value of a most significant bit (MSB) of a digital value to be converted according to the comparison result of the second comparator, determining values of bits successive to the MSB according to the comparison result of the first comparator, and generating the estimated digital values by applying estimated values to undetermined bits; and
   a digital/analog converter generating the comparison voltages by using the estimated digital values and the reference voltage.

2. A time-interleaved successive approximation analog/digital converter comprising:
   a plurality of analog/digital converters successively operating according to corresponding clock cycles, each of the plurality of analog/digital converters comprising: a sample & hold part sampling and holding an intensity of an analog input signal by using a single clock cycle of a clock signal; a first comparator comparing the intensity of the analog input signal held by the sample & hold part with comparison voltages determined according to estimated digital values per clock cycle following an operating clock cycle of the sample & hold part; a successive approximation register determining values of bits successive to a most significant bit (MSB) of a digital value to be converted according to the comparison result of the first comparator and generating the estimated digital values by applying estimated values to undetermined bits; and a digital/analog converter generating the comparison voltages by using the estimated digital values and a preset reference voltage;
   a second comparator comparing the intensity of the analog input signal with a value equal to ½ of the preset reference voltage in the latter half of the operating clock cycle of the sample & hold part included in each of the plurality of analog/digital converters; and
   a switching part transmitting the comparison result of the second comparator to the successive approximation register included in each of the plurality of analog/digital converters according to operating clock cycles of the plurality of corresponding analog/digital converters,
   wherein the successive approximation register included in each of the plurality of analog/digital converters determines a value of the MSB of the digital value to be converted according to the comparison result of the second comparator.

* * * * *